United States Patent
Marsh

(10) Patent No.: US 6,265,722 B1
(45) Date of Patent: Jul. 24, 2001

(54) ORGANIC FIELD IONIZATION SOURCE

(75) Inventor: Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/386,976

(22) Filed: Aug. 31, 1999

(51) Int. Cl.$^7$ .................................................. H01J 37/317
(52) U.S. Cl. ............................... 250/423 F; 250/423 R; 250/309
(58) Field of Search .................... 250/423 F, 425, 250/423 R, 309

(56) References Cited

U.S. PATENT DOCUMENTS

| | | |
|---|---|---|
| 4,496,843 * | 1/1985 | Kirita et al. ...................... 250/423 R |
| 4,617,203 | 10/1986 | Jergenson . |
| 4,755,683 | 7/1988 | Bell et al. . |
| 5,064,520 | 11/1991 | Miyake et al. . |
| 5,245,186 | 9/1993 | Chait et al. . |
| 5,583,344 | 12/1996 | Mizumura et al. . |

OTHER PUBLICATIONS

Sikola Et Al., "In situ study of processes taking place on silicon surface during its bombardment by CFx/Ar ions: Etching Versus Polymerization", J. Vac. Sci. Technology, Nov./Dec. 1996, 3156–3163, vol. 14 No. 6.

Blain Et Al., "A new experimental method for determining secondary ion yields from surfaces bombarded by complex heterogeneous ions", J. Vac. Sco. Technology, May/Jun. 1990, 2265–2268, vol. 8, No. 3.

Baudin Et Al., "A Novel Molecular Ion Source Based on Spontaneous Desorption", 763–767.

M. Benguerba Et Al., "Impact of slow gold clusters on vaioius solids: nonlinear effects in secondary ion emission", Elsevier Science Publishers B.V., 1991, 8–22.

\* cited by examiner

*Primary Examiner*—Kiet T. Nguyen
(74) *Attorney, Agent, or Firm*—Killworth, Gottman, Hagan & Schaeff LLP

(57) ABSTRACT

An organic field ionization source is provided including an ionization needle, an extraction electrode, a voltage source, and a heated reservoir. The ionization needle defines a tip. The extraction electrode defines an extraction aperture therein and the extraction electrode is positioned such that the extraction aperture is disposed proximate the tip of the ionization needle. The voltage source is arranged to maintain the tip of the ionization needle at a high potential relative to the extraction electrode. The heated reservoir contains an organic ion source material therein in contact with the ionization needle. The heated reservoir is arranged to maintain a temperature of the organic ion source material at a magnitude sufficient to encourage capillary flow of the organic ion source material from the heated reservoir along the ionization needle to the tip of the needle. The high potential, the extraction electrode, the tip of the ionization needle, and the organic ion source material are selected and arranged such that the organic material is ionized at the tip of the needle and such that organic ions are drawn through the extraction aperture from the tip of the needle. The organic ion source material preferably comprises coronene, phenylalanine, a vacuum grease, a diffusion pump oil, or another organic material with a high boiling point.

22 Claims, 1 Drawing Sheet

ORGANIC FIELD IONIZATION SOURCE

BACKGROUND OF THE INVENTION

The present invention relates to ion beam devices and, more particularly, to a field ionization source that is specially configured to minimize contamination of an ion beam target.

Liquid metal ion guns are used routinely to generate focused ion beams for analysis of a substrate. Liquid metal ion sources are typically very bright and are well-suited for applications requiring sharp focus of the ion beam and maintenance of a suitable ion fluence. Typically, the ion fluence of a liquid metal ion gun is of the same order as that of a field emission source of a conventional scanning electron microscope. However, liquid metal ion guns typically use gallium, indium, or gold.

The present invention embodies the recognition that gallium, indium, gold, and other conventional materials are not well suited for all ion source applications. For example, where an ion beam is to be used to analyze a semiconductor target, the use of gallium, indium, or gold as a sputter ion source material may lead to unacceptable contamination of the substrate. Accordingly, there is a need for a field ionization source that does not embody the disadvantages of the conventional types of ion sources, particularly in the context of focused ion beam defect analysis systems.

BRIEF SUMMARY OF THE INVENTION

This need is met by the present invention wherein an organic field ionization source is provided and is arranged to be suitable for use in focused ion beam defect analysis systems.

In accordance with one embodiment of the present invention, an organic field ionization source is provided comprising: an ionization needle, an extraction electrode, a voltage source, and a heated reservoir. The ionization needle defines a tip. The extraction electrode defines an extraction aperture therein and is positioned such that the extraction aperture is disposed proximate the tip of the ionization needle. The voltage source is arranged to maintain the tip of the ionization needle at a high potential relative to the extraction electrode. The heated reservoir contains an organic ion source material therein in contact with the ionization needle. The heated reservoir is arranged to maintain a temperature of the organic ion source material at a magnitude sufficient to encourage capillary flow of the organic ion source material from the heated reservoir along the ionization needle to the tip of the needle. The high potential, the extraction electrode, the tip of the ionization needle, and the organic ion source material are selected and arranged such that the organic material is ionized at the tip of the needle and such that organic ions are drawn through the extraction aperture from the tip of the needle.

The organic ion source material preferably comprises coronene, phenylalanine, a vacuum grease, a diffusion pump oil, or another organic material with a boiling point of at least from about 250° C. to about 450° C.

In accordance with another embodiment of the present invention, a focused ion beam defect analysis system is provided comprising an organic field ionization source, a target, and an electrode assembly. The organic field ionization source comprises an ionization needle, an extraction electrode, a voltage source, and a heated reservoir. The ionization needle defines a tip. The extraction electrode defines an extraction aperture therein and is positioned such that the extraction aperture is disposed proximate the tip of the ionization needle. The voltage source is arranged to maintain the tip of the ionization needle at a high potential relative to the extraction electrode. The heated reservoir contains an organic ion source material therein in contact with the ionization needle and is arranged to maintain a temperature of the organic ion source material at a magnitude sufficient to encourage capillary flow of the organic ion source material from the heated reservoir along the ionization needle to the tip of the needle. The high potential, the extraction electrode, the tip of the ionization needle, and the organic ion source material are selected and arranged such that the organic material is ionized at the tip of the needle and such that organic ions are drawn through the extraction aperture from the tip of the needle. The target is subject to analysis by the organic ions and the electrode assembly is arranged along the path of the ions and is configured to direct the organic ions to the target.

The organic ions may comprise fragments of the organic ion source material and the electrode assembly may include a filter arranged to cause selected ones of the fragments to be directed away from the target. The filter may comprise a Wein filter, a magnetic sector, or a time-of-flight system. The electrode assembly may include an ion accelerating electrode, an ion beam focusing electrode, ion beam scanning electrode, and a ion beam deflecting electrode.

In accordance with yet another embodiment of the present invention, a focused ion beam defect analysis system is provided comprising an organic field ionization source, a target, an electrode assembly, and a particle analyzer. The organic field ionization source is arranged to ionize organic ion source material. The electrode assembly is arranged along the path of the ions and is configured to direct the organic ions to the target. The target is subject to analysis by the organic ions and the particle analyzer is arranged to detect particles ejected from the target in response to the incidence of the organic ions on the target.

Accordingly, it is an object of the present invention to provide a field ionization source that is specially configured to minimize contamination of an ion beam target so as to be suitable for use in focused ion beam defect analysis systems, focused ion beam milling systems, or other types of focused ion beam systems. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

Figure 1:
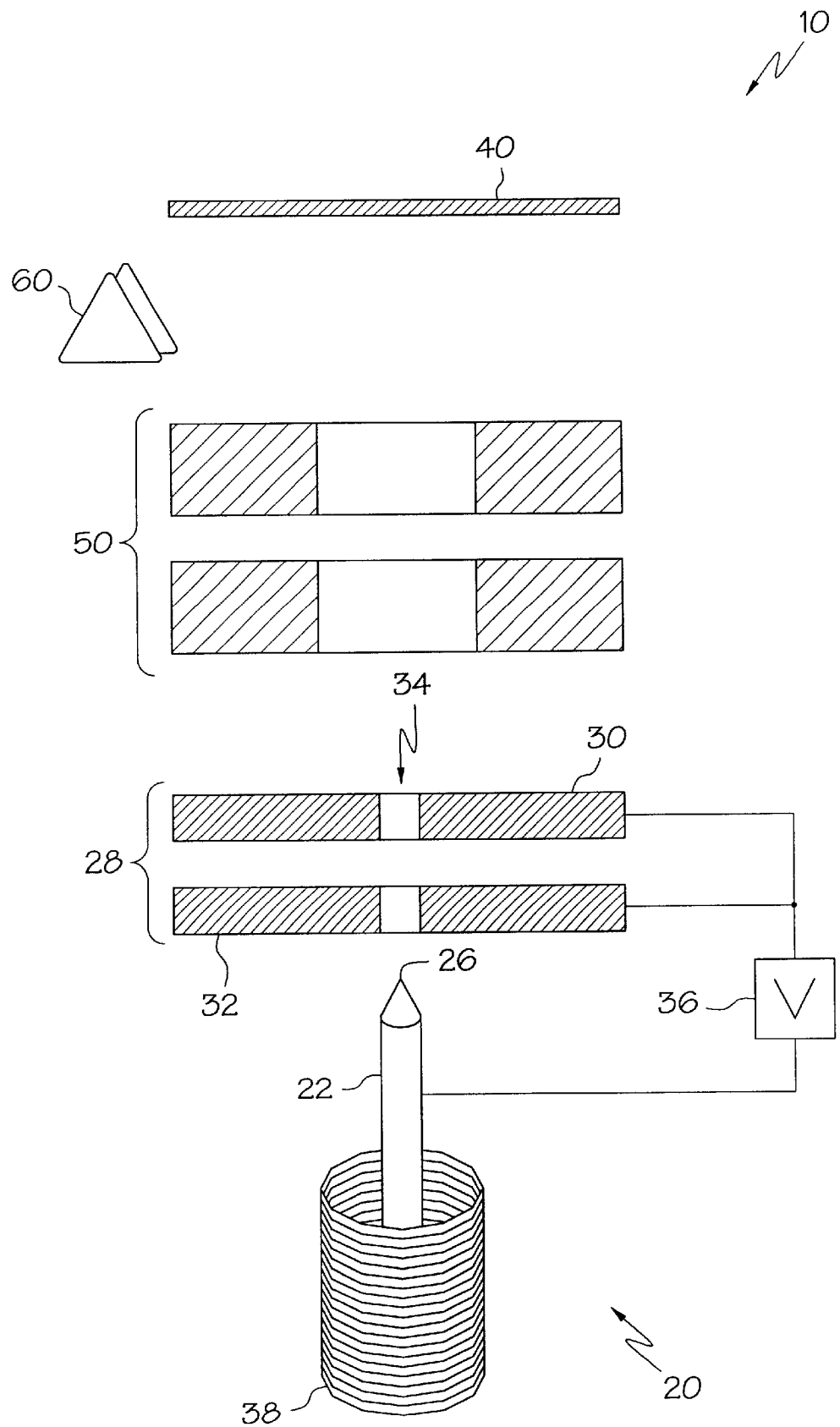
FIG. 1 is a schematic illustration of a focused ion beam defect analysis system including an organic field ionization source according to the present invention.

Referring now to FIG. 1, a focused ion beam defect analysis system 10 and an organic field ionization source 20 according to the present invention is illustrated in detail. As will be appreciated by those practicing the present invention, the organic field ionization source 20 is arranged to operate in a vacuum. The focused ion beam defect analysis system 10 comprises the organic field ionization source 20, a target 40 subject to analysis, an electrode assembly 50, and a particle analyzer 60. The organic field ionization source 20 includes an ionization needle 22 defining a tip 26. The ionization source 20 further includes an extraction electrode assembly 28 incorporating an extractor 30 and a suppressor 32, each defining an extraction aperture 34 therein. Additionally, the ionization source 20 includes a voltage source 36 and a heated reservoir 38 containing an organic ion source material therein.

The extraction electrode assembly 28 is positioned such that the extraction aperture 34 is disposed proximate the tip 26 of the ionization needle 22. The voltage source 36 is arranged to maintain the ionization needle 22 and, more particularly, the tip 26 of the ionization needle 22, at a high positive potential relative to the extraction electrode assembly 28.

The heated reservoir 38 contains the organic ion source material in contact with the ionization needle 22 and is arranged to maintain the temperature of the organic ion source material at a magnitude sufficient to encourage capillary flow of the organic ion source material from the heated reservoir 38 along the ionization needle 22 to the tip 26 of the needle 22. The magnitude of the high potential and the relative positions of the extraction electrode assembly 28, the extraction aperture 34 and the tip of the ionization needle 22 are selected such that the organic ion source material is ionized at the tip of 26 of the needle 22 and such that organic ions are drawn through the extraction aperture 34 from the tip 26 of the needle 22. The specific selection and arrangement of these elements and the specific operating parameters utilized according to the present invention will vary depending on the design preferences of those practicing the present invention and the nature of the organic ion source material utilized. It is noted that a suitable voltage source 36 will be capable of generating a potential difference of about 1000 V to about 50,000 V between the ionization needle 22 and the extraction electrode assembly 28. The spacing between the tip 26 of the needle 22 and the extraction aperture 34 is typically about 0.1 mm to about 5.0 mm. The temperature imposed upon the organic ion source material by the heated reservoir 38 is selected to be sufficient to place the material in a low viscosity liquid phase. It is contemplated by the present invention that suitable operating parameters may be determined without undue experimentation by those of ordinary skill in the art of focused ion beam generation. Any one of a number of commercially available reservoir and needle arrangements may be suitable for use in the present invention. For example, a suitable heated reservoir 38 and needle 22 arrangement is available as a two lens ion column from the FEI Company of Hillsboro, Oreg. under the product identifier 2LI.

The target 40 typically comprises a semiconductor substrate but may comprise any substrate suitable for analysis by organic ions. According to one embodiment of the present invention, the organic ions drawn through the extraction aperture 34 and focused by the electrode assembly 50 cause ejection of particles from the target 40. The particle analyzer 60 is arranged to detect the ejected particles and provide an output indicative of the nature of the ejected particles. This output is utilized to characterize and analyze the target 40.

The electrode assembly 50 is arranged along the path of the organic ions drawn through the extraction aperture 34 and is configured to direct the organic ions to the target 40. The specific nature and design of the electrode assembly 50 is beyond the scope of the present invention. However, it is noted that the design of the electrode assembly 50 may be derived or taken directly from existing focused ion beam system designs. In fact, it is noted that the organic field ionization source 20 may be employed in a commercially available focused ion beam system, such as a two lens ion column available from the FEI Company of Hillsboro, Oreg. under the product identifier the FEI Company of Hillsboro, Oreg. under the product identifier 2LI.

Typically, the organic ions drawn through the extraction aperture 34 comprise fragments of the organic ion source material. In which case, the electrode assembly 50 may include a filter, e.g., a Wein filter, a magnetic sector, or time-of-flight device, arranged to cause selected ones of the fragments to be directed away from the target 40. The electrode assembly 50 also typically includes an ion accelerating electrode, an ion beam focusing electrode, an ion beam scanning electrode, and ion beam deflecting electrode to enhance and direct the incidence of organic ions on the target 40.

Suitable organic ion source materials comprises coronene, phenylalanine, or any one of a number of vacuum greases or diffusion pump oils. Preferably, the organic ion source material comprises an organic material with a boiling point of at least about 250° C. to about 450° C. These types of organic materials are particularly well-suited for used in focused ion beam defect analysis systems because they are less likely that conventional liquid metal ion sources to cause deleterious contamination of the target under examination.

Having described the invention in detail and by reference to preferred embodiments thereof, it will be apparent that modifications and variations are possible without departing from the scope of the invention defined in the appended claims.

What is claimed is:

1. An organic field ionization source comprising:

an ionization needle defining a tip;

an extraction electrode defining an extraction aperture therein, wherein said extraction electrode is positioned such that said extraction aperture is disposed proximate said tip of said ionization needle;

a voltage source arranged to maintain said tip of said ionization needle at a high potential relative to said extraction electrode; and a heated reservoir containing an organic ion source material therein in contact with said ionization needle, said heated reservoir being arranged to maintain a temperature of said organic ion source material at a magnitude sufficient to encourage capillary flow of said organic ion source material from said heated reservoir along said ionization needle to said tip of said needle, wherein said high potential, said extraction electrode, said tip of said ionization needle, and said organic ion source material are selected and arranged such that said organic material is ionized at said tip of said needle and such that organic ions are drawn through said extraction aperture from said tip of said needle.

2. An organic field ionization source as claimed in claim 1 wherein said organic ions comprise fragments of said organic ion source material.

3. An organic field ionization source as claimed in claim 1 wherein said voltage source is arranged such that said of said ionization needle is maintained at a high positive potential relative to said extraction electrode.

4. An organic field ionization source as claimed in claim 1 wherein said organic field ionization source is arranged to operate in a vacuum.

5. An organic field ionization source comprising:
an ionization needle defining a tip;
an extraction electrode defining an extraction aperture therein, wherein said extraction electrode is positioned such that said extraction aperture is disposed proximate said tip of said ionization needle;
a voltage source arranged to maintain said tip of said ionization needle at a high potential relative to said extraction electrode; and
a heated reservoir containing coronene therein in contact with said ionization needle, said heated reservoir being arranged to maintain a temperature of said coronene at a magnitude sufficient to encourage capillary flow of said coronene from said heated reservoir along said ionization needle to said tip of said needle, wherein said high potential, said extraction electrode, said tip of said ionization needle, and said coronene are selected and arranged such that said coronene is ionized at said tip of said needle and such that coronene ions are drawn through said extraction aperture from said tip of said needle.

6. An organic field ionization source comprising:
an ionization needle defining a tip;
an extraction electrode defining an extraction aperture therein, wherein said extraction electrode is positioned such that said extraction aperture is disposed proximate said tip of said ionization needle;
a voltage source arranged to maintain said tip of said ionization needle at a high potential relative to said extraction electrode; and
a heated reservoir containing phenylalanine therein in contact with said ionization needle, said heated reservoir being arranged to maintain a temperature of said phenylalanine at a magnitude sufficient to encourage capillary flow of said phenylalanine from said heated reservoir along said ionization needle to said tip of said needle, wherein said high potential, said extraction electrode, said tip of said ionization needle, and said phenylalanine are selected and arranged such that said phenylalanine is ionized at said tip of said needle and such that organic ions are drawn through said extraction aperture from said tip of said needle.

7. An organic field ionization source comprising:
an ionization needle defining a tip;
an extraction electrode defining an extraction aperture therein, wherein said extraction electrode is positioned such that said extraction aperture is disposed proximate said tip of said ionization needle;
a voltage source arranged to maintain said tip of said ionization needle at a high potential relative to said extraction electrode; and
a heated reservoir containing a vacuum grease therein in contact with said ionization needle, said heated reservoir being arranged to maintain a temperature of said vacuum grease at a magnitude sufficient to encourage capillary flow of said vacuum grease from said heated reservoir along said ionization needle to said tip of said needle, wherein said high potential, said extraction electrode, said tip of said ionization needle, and said vacuum grease are selected and arranged such that said vacuum grease is ionized at said tip of said needle and such that vacuum grease ions are drawn through said extraction aperture from said tip of said needle.

8. An organic field ionization source comprising:
an ionization needle defining a tip;
an extraction electrode defining an extraction aperture therein, wherein said extraction electrode is positioned such that said extraction aperture is disposed proximate said tip of said ionization needle;
a voltage source arranged to maintain said tip of said ionization needle at a high potential relative to said extraction electrode; and
a heated reservoir containing a diffusion pump oil therein in contact with said ionization needle, said heated reservoir being arranged to maintain a temperature of said diffusion pump oil at a magnitude sufficient to encourage capillary flow of said diffusion pump oil from said heated reservoir along said ionization needle to said tip of said needle, wherein said high potential, said extraction electrode, said tip of said ionization needle, and said diffusion pump oil are selected and arranged such that said diffusion pump oil is ionized at said tip of said needle and such that diffusion pump oil ions are drawn through said extraction aperture from said tip of said needle.

9. An organic field ionization source comprising:
an ionization needle defining a tip;
an extraction electrode defining an extraction aperture therein, wherein said extraction electrode is positioned such that said extraction aperture is disposed proximate said tip of said ionization needle;
a voltage source arranged to maintain said tip of said ionization needle at a high potential relative to said extraction electrode; and
a heated reservoir containing an organic ion source material therein, wherein
said organic ion source material is characterized by a boiling point of at least about 250° C. to about 450° C.,
said heated reservoir is arranged such that said organic ion source material is in contact with said ionization needle and such that a temperature of said organic ion source material is maintained at a magnitude sufficient to encourage capillary flow of said organic ion source material from said heated reservoir along said ionization needle to said tip of said needle, and
said high potential, said extraction electrode, said tip of said ionization needle, and said organic ion source material are selected and arranged such that said organic material is ionized at said tip of said needle and such that organic ions are drawn through said extraction aperture from said tip of said needle.

10. A focused ion beam system comprising:
an organic field ionization source comprising:
an ionization needle defining a tip,
an extraction electrode defining an extraction aperture therein, wherein said extraction electrode is positioned such that said extraction aperture is disposed proximate said tip of said ionization needle,
a voltage source arranged to maintain said tip of said ionization needle at a high potential relative to said extraction electrode, and
a heated reservoir containing an organic ion source material therein in contact with said ionization needle, said heated reservoir being arranged to maintain a temperature of said organic ion source material at a magnitude sufficient to encourage capillary flow of said organic ion source material from said heated reservoir along said ionization needle to said tip of said needle, wherein said high potential, said extraction electrode, said tip of said ionization needle, and said organic ion source material are selected and arranged such that said organic material is ionized at said tip of said needle and such that organic ions are drawn through said extraction aperture from said tip of said needle;

a target subject to analysis by said organic ions; and an electrode assembly arranged along the path of said ions and configured to direct said organic ions to said target.

11. A focused ion beam system as claimed in claim 10 wherein said organic ions comprise fragments of said organic ion source material and wherein said electrode assembly includes a filter arranged to cause selected ones of said fragments to be directed away from said target.

12. A focused ion beam as claimed in claim 11 wherein said filter comprises a Wein filter, a magnetic sector, or a time-of-flight apparatus.

13. A focused ion beam system as claimed in claim 10 wherein said electrode assembly includes an ion accelerating electrode.

14. A focused ion beam system as claimed in claim 10 wherein said electrode assembly includes an ion beam focusing electrode.

15. A focused ion beam system as claimed in claim 10 wherein said electrode assembly includes an ion beam scanning electrode.

16. A focused ion beam system as claimed in claim 10 wherein said electrode assembly includes an ion beam deflecting electrode.

17. A focused ion beam system as claimed in claim 10 wherein said organic ion source material comprises coronene.

18. A focused ion beam system as claimed in claim 10 wherein said organic ion source material comprises phenylalanine.

19. A focused ion beam system as claimed in claim 10 wherein said organic ion source material comprises a vacuum grease.

20. A focused ion beam system as claimed in claim 10 wherein said organic ion source material comprises a diffusion pump oil.

21. A focused ion beam system as claimed in claim 10 wherein said organic ion source material comprises an organic material with a boiling point of at least about 250° C. to about 450° C.

22. A focused ion beam target surface analysis system comprising:

an organic field ionization source comprising an ionization needle defining a tip, an extraction electrode defining an extraction aperture therein, wherein said extraction electrode is positioned such that said extraction aperture is disposed proximate said tip of said ionization needle, a voltage source arranged to maintain said tip of said ionization needle at a high potential relative to said extraction electrode, a heated reservoir containing an organic ion source material therein in contact with said ionization needle, said heated reservoir being arranged to maintain a temperature of said organic ion source material at a magnitude sufficient to encourage capillary flow of said organic ion source material from said heated reservoir along said ionization needle to said tip of said needle, wherein said high potential, said extraction electrode, said tip of said ionization needle, and said organic ion source material are selected and arranged such that said organic material is ionized at said tip of said needle and such that organic ions are drawn through said extraction aperture from said tip of said needle;

a target subject to analysis by said organic ions;

an electrode assembly arranged along the path of said ions and configured to direct said organic ions to said target such that said organic ions cause ejection of particles from said target; and a particle analyzer arranged to detect said ejected particles.

* * * * *

UNITED STATES PATENT AND TRADEMARK OFFICE
CERTIFICATE OF CORRECTION

PATENT NO.   : 6,265,722 B1
DATED        : July 24, 2001
INVENTOR(S)  : Marsh

It is certified that error appears in the above-identified patent and that said Letters Patent is hereby corrected as shown below:

Column 3,
Line 26, "tip of 26" should be -- tip 26 --.

Column 4,
Line 5, "the FEI Company of Hillsboro, Oreg. under the product identifier the FEI Company of Hillsboro, Oreg. under the product identifier 2LI." should be -- the FEI Company of Hillsboro, Oregon under the product identifier 2LI. --.
Line 23, "used" should be -- use --.
Line 26, "that" should be -- than --.
Line 62, "said of said" should be -- said tip of said --.

Column 5,
Line 42, "organic" should be -- phenylalanine --.

Signed and Sealed this

First Day of January, 2002

Attest:

Attesting Officer

JAMES E. ROGAN
Director of the United States Patent and Trademark Office